(12) United States Patent
Nakagawa et al.

(10) Patent No.: US 7,920,043 B2
(45) Date of Patent: Apr. 5, 2011

(54) PLANAR MAGNETIC DEVICE AND POWER SUPPLY IC PACKAGE USING SAME

(75) Inventors: Katsutoshi Nakagawa, Yokohama (JP); Tetsuo Inoue, Yokohama (JP); Akira Sato, Yokohama (JP)

(73) Assignees: Kabushiki Kaisha Toshiba, Tokyo (JP); Toshiba Materials Co., Ltd., Yokohama-Shi (JP)

( * ) Notice: Subject to any disclaimer, the term of this patent is extended or adjusted under 35 U.S.C. 154(b) by 115 days.

(21) Appl. No.: 12/091,619

(22) PCT Filed: Oct. 26, 2006

(86) PCT No.: PCT/JP2006/321367
§ 371 (c)(1),
(2), (4) Date: Apr. 25, 2008

(87) PCT Pub. No.: WO2007/049692
PCT Pub. Date: May 3, 2007

(65) Prior Publication Data
US 2009/0045905 A1 Feb. 19, 2009

(30) Foreign Application Priority Data
Oct. 27, 2005 (JP) .................................. 2005-313311

(51) Int. Cl.
*H01F 27/28* (2006.01)
*H01F 5/00* (2006.01)
*H01F 27/24* (2006.01)
*H01F 7/06* (2006.01)

(52) U.S. Cl. ........ 336/232; 336/200; 336/223; 336/233; 29/602.1

(58) Field of Classification Search .................. None
See application file for complete search history.

(56) References Cited

U.S. PATENT DOCUMENTS

| | | | | |
|---|---|---|---|---|
| 6,091,310 A * | 7/2000 | Utsumi et al. | .................. | 333/12 |
| 6,414,564 B1 * | 7/2002 | Mizoguchi et al. | ............. | 333/35 |
| 6,658,724 B2 * | 12/2003 | Nakano et al. | .................. | 29/609 |
| 6,710,692 B2 * | 3/2004 | Kato et al. | ...................... | 336/83 |
| 6,713,162 B2 * | 3/2004 | Takaya et al. | ................. | 428/209 |
| 6,914,513 B1 * | 7/2005 | Wahlers et al. | ............... | 336/233 |
| 7,259,648 B2 * | 8/2007 | Matsutani et al. | ............ | 336/200 |
| 2003/0184426 A1 * | 10/2003 | Song | .............................. | 336/200 |
| 2006/0152321 A1 * | 7/2006 | Jung et al. | ..................... | 336/200 |

FOREIGN PATENT DOCUMENTS

| | | |
|---|---|---|
| CN | 1321991 A | 11/2001 |
| JP | 5 275247 | 10/1993 |
| JP | 2002-299122 A * | 2/2001 |
| JP | 2002 299120 | 10/2002 |
| JP | 2002 299122 | 10/2002 |
| JP | 2002 353030 | 12/2002 |
| JP | 2003 17322 | 1/2003 |
| KR | 2001-109462 | 12/2001 |

* cited by examiner

*Primary Examiner* — Anh T Mai
*Assistant Examiner* — Mangtin Lian
(74) *Attorney, Agent, or Firm* — Oblon, Spivak, McClelland, Maier & Neustadt, L.L.P.

(57) ABSTRACT

A planar magnetic device 1 includes a first magnetic layer 3 and a second magnetic layer 5 that are made of a mixture of a magnetic powder 7 and a resin, and a planar coil 4 disposed between the magnetic layers. When the planar coil 4 has an adjacent winding interval W between the potions 4c of the coil and the magnetic powder 7 has a maximum particle size L, planar magnetic device 1 satisfies the relationship W>L. In the planar magnetic device 1 having the above structure, fine magnetic powder that can produce a high inductance fills the spaces between the adjacent windings. Thus, the invention can achieve a high-performance planar magnetic device, such as a thin inductor.

13 Claims, 5 Drawing Sheets

PLANAR MAGNETIC DEVICE AND POWER SUPPLY IC PACKAGE USING SAME

TECHNICAL FIELD

The present invention relates to planar magnetic device (magnetic passive element, planar inductor) used as thin inductors, and particularly to a planar magnetic device whose magnetic permeability in the magnetic field generated in a planar coil is enhanced to increase the inductance, and to a power IC package including the same.

BACKGROUND ART

As electronic apparatuses have been reduced in size and weight, various devices tend to be manufactured in thin-film processes. In this trend, a planar magnetic device (planar inductor) having an external-iron structure has been proposed as magnetic devices, such as inductors (reactors), transformers, and magnetic heads, in addition to the structure in which wire is wound around a known bulk magnetic material. In the external-iron structure, a planar coil having a spiral shape or a zigzag (meander type) pattern is coated with a magnetic material. It is thus being attempted to miniaturize devices (see, for example, Non-Patent Document 1).

On the other hand, a technical demand is being increased that devices are operated at an operation frequency on the order of MHz or more to achieve small lightweight electronic apparatuses, as in, for example, a DC-DC converter for small electronic apparatuses. Such an electronic apparatus includes a high-frequency inductor as a key component. The high-frequency inductor requires:

(1) being thin and small;
(2) having superior frequency characteristics; and
(3) having an appropriate power capacity.

In general, practically used miniature inductor elements include a type in which wire is coiled around bulk ferrite material and a type produced by integrally firing a coating ferrite material and a coating conductive material (see, for example, Patent Document 1). The former increases the proportion of degraded portions at the surface to total volume as the bulk ferrite core is reduced in size and thickness, and accordingly, the characteristics, such as magnetic permeability, are degraded. Consequently, it becomes difficult to achieve a low-loss, high inductance inductor element. The latter is produced by patterning a coli in a spiral or toroidal shape, applying ferrite so that the soft magnetic material can be excited by the coil, and finally firing the coil and the ferrite. For example, a toroidal inductor is manufactured through the step of alternately patterning ferrite and a conductor by coating.

Patent Document 1: Japanese Unexamined Patent Application Publication No. 2002-299120
Non-Patent Document 1: IEEE Trans. Magn. MAG-20, No. 5, pp. 1804-1806.

However, soft magnetic materials used in the known inductors generally have low magnetic permeability, and accordingly the inductors do not easily produce high inductance unfortunately. However, if a large amount of magnetic material is used to compensate the above disadvantage in a magnetic device, such as an inductor, it is limited to reduce the thickness of the magnetic device. This makes it difficult to miniaturize apparatuses by high-densely packaging components.

DISCLOSURE OF INVENTION

According to the above-described circumstances in which a large amount of magnetic material must be used because of low magnetic permeability, an object of the present invention is to achieve a planar magnetic device, such as a thin inductor, by use of an arrangement structure that can produce a high inductance effectively.

In order to achieve the above object, the inventors of the invention have conducted intensive research on sizing and arrangement of magnetic powder that can produce a particularly high inductance, and confirmed through experiments that those factors influence the characteristics of the magnetic device. More specifically, it has been found that the magnetic permeability in a magnetic field generated in the coil is not increased effectively to achieve a thin inductor exhibiting a high inductance unless the winding interval of the coil and the maximum particle size of the magnetic powder are adjusted to establish a predetermined relationship so that the magnetic powder fill the spaces between the windings of the coil, or unless the magnetic powder contained in the magnetic layer comes in direct contact with the planar coil or comes close to the planar coil at a distance of 1 µm or less without forming an insulating layer between the planar coil and the magnetic layers over and under the planar coil. It has been found that when, in particular, insulating layers are not disposed between the planar coil and the upper and lower magnetic layers, the magnetic flux running through the upper and lower magnetic layers can be increased to increase the inductance. The invention has been accomplished according to these findings.

Accordingly, the present invention provides a planar magnetic device including a first and a second magnetic layer made of a mixture of a magnetic powder and a resin and a planar coil disposed between the first and the second magnetic layer. The planar coil and the magnetic powder satisfy the relationship W>L, where W represents the intervals between the windings of the planar coil and L represents the maximum particle size of the magnetic powder.

In the planar magnetic device, the winding interval W of the planar coil refers to the linear distance between any two opposing portions of the coil wire, or the interval between any two adjacent portions of the coil wire, as shown in FIGS. 1 to 5. When the coil wire has a portion bended in an L-shape, the L-shaped portion is not subject to the measurement for the interval W.

The maximum particle size L of magnetic powder filling the spaces between the windings of the coil is measured as below. A macrophotograph of a magnetic layer shown in FIG. 7 defined between two portions 4c of the wire of the planar coil 4 is taken and the largest particle in the magnetic powder 7 is measured for the diameter (see FIG. 6). The measurement is performed on any three points on the surface of the particle, and the largest value of the measurements is defined as the maximum particle size L of the magnetic powder.

In a stage where the magnetic powder is prepared by, for example, gas-water atomization and by screening the atomized powder, the maximum particle size L of such magnetic powder corresponds to the size of the opening of the screen used.

In the above planar magnetic device, when the magnetic powder of the planar magnetic device has a maximum particle size L equal to or larger than the winding interval W (W≦L), the magnetic powder does not fill the spaces between the windings, or if filling the spaces, the particles are disposed with their longitudinal axes extending in the longitudinal direction of the spaces. Consequently, the magnetic powder filling the spaces between the windings becomes liable to be affected by the magnetic field generated by the coil, and the inductance of the planar coil becomes liable to be reduced.

Thus, the maximum particle size L of the magnetic powder is set to be smaller than the winding interval W. The inductance of a planar magnetic device can be increased when the maximum particle size is in the range of lower than the maximum particle size.

The magnetic powder and the magnetic material forming the magnetic layers include, but not limited to, metal soft magnetic materials such as Permalloy (Fe-78.5Ni) and other Fe—Ni alloys, Co amorphous alloys, Fe amorphous alloys, and silicon steel (Fe-5.5Si), and oxide such as ferrite, in addition to pure iron and Sendust (Fe-5.5Al-10Si). Preferably, the amorphous alloys are compounds expressed by the general formula $(M_{1-a}M'_a)_{100-b}X_b$ (where M represents at least one selected from Fe and Co; M'represents at least one element selected from the group consisting of Ti, V, Cr, Mn, Ni, Cu, Zr, Nb, Mo, Ta, and W; X represents at least one element selected from the group consisting of B, Si, C, and P, and a and b each satisfy the relationships $0 \leq a \leq 0.15$ and 10 at % $\leq b \leq$ 35 at %). An Fe-based material, such as Sendust or an Fe amorphous alloy is preferred from the viewpoint of cost.

The planar coil may have an angular spiral shape as shown in FIG. 1, a meander shape formed in a zigzag manner as shown in FIG. 4, or a round spiral shape as shown in FIG. 5, and any shape can produce the effect of increasing the inductance as long as adjacent portions of the conductive windings of the planar coil are in parallel with each other. The thickness (height) of the planar coil is controlled to be about 10 to 200 μm.

Preferably, the magnetic powder contained in the magnetic layers is in contact with the planar coil or is close to the planar coil at a distance of 1 μm or less. By bringing the magnetic powder in the magnetic layers into direct contact with the planar coil or bringing the magnetic powder close to the planar coil at a distance of 1 μm or less, the magnetic permeability in the magnetic field generated in the coil can be increased effectively, and accordingly, the resulting thin inductor can exhibits a high inductance.

Preferably, the planar coil and the magnetic powder satisfy the relationship W>2L, where W represents the winding interval of the planar coil while L represents the maximum particle size of the magnetic powder. By reducing the particle size of the magnetic powder so that the maximum particle size L of the magnetic powder satisfies the relationship W>2L, the magnetic powder can be filled in the spaces between the windings of the coil effectively. Consequently, the magnetic permeability in the magnetic field generated in the coil can be increased effectively, and accordingly the inductance of the coil can be increased effectively.

Further, in the above planar magnetic device, it is preferable that the magnetic powder has an average particle size of 80 μm or less. Coarse magnetic powder having an average particle size of more than 80 μm does not sufficiently fill the spaces formed between the windings and the packing ratio of the magnetic powder in the spaces is reduced. It is not expected that the inductance is increased. Thus, the average particle size of the magnetic powder is preferably 80 μm or less, more preferably 50 μm or less, and further preferably 35 μm or less. In contrast, magnetic powder having an average particle size D of less than 0.5 μm is too fine to handle. More specifically, such magnetic powder easily forms a surface-oxidized layer or a surface-degraded layer to degrade the magnetic characteristics easily, or is easily affected by thermal vibration to degrade the magnetic characteristics. In addition, for preparing a paste, such powder is undesirably not homogeneously mixed.

Furthermore, in the above planar magnetic device, it is preferable that the magnetic powder fills the spaces between the windings of the planar coil at a packing ratio of 30% by volume or more. An excessively low packing ratio of less than 30% by volume of the magnetic powder undesirably reduces the inductance of the planar magnetic device. Thus, the packing ratio of the magnetic powder is preferably 30% by volume or more, and more preferably 50% by volume or more.

Preferably, at least three particles of the magnetic powder are disposed in a segment having a length W defined by the winding interval W of the planar coil. The number of the magnetic powder particles is measured as shown in FIG. 7. More specifically, magnetic powder particles 7 disposed in the segment having a length W corresponding to the width W of the space between two opposing portions 4c of the coil wire are counted, including particles that are partially disposed in the segment. In FIG. 7, five magnetic powder particles 7 are disposed in the segment. If the number of magnetic powder particles in the space of the windings is 2 or less, the packing ratio of the magnetic powder in the magnetic layer becomes low, and accordingly the magnetic layer does not produce sufficient magnetic characteristics. Thus, the number of magnetic powder particles disposed in line between the windings is set to 3 or more, and more preferably 5 or more.

Further, in the above planar magnetic device, it is preferable that the magnetic powder (particles) contains at least one magnetic material selected from the group consisting of amorphous alloys, Fe microcrystalline alloys having an average grain size of 2 μm or less, and ferrite. By filling the spaces between the windings of the coil with the magnetic particles containing those magnetic materials, the magnetic permeability can be increased, and accordingly the inductance of the planar magnetic device can be increased. In this instance, use of the magnetic powder used in the first magnetic layer or the second magnetic layer enhances the manufacturability.

Furthermore, in the above planar magnetic device, it is also preferable that the total thickness of the planar magnetic device is 0.4 mm or less. The present invention is intended to achieve a miniature circuit component by packaging a planar magnetic device and an IC chip in the same package. The planar magnetic device has an advantage in packaging in a single package only when its thickness is less than that of the semiconductor chip. Hence, the thickness of the planar magnetic device is at most less than 0.625 mm, which is the general thickness of the pellet of the semiconductor element, and preferably 0.4 mm or less. In particular, by setting the thickness of the planar magnetic device at about 0.4 mm or less, a stacked type element as shown in FIGS. 8 to 10, described later, can be packaged in a single package. Preferably, the first magnetic layer and the second magnetic layer of the planar magnetic device each have a thickness of about 50 to 200 μm.

Preferably, the planar coil is made of a metal powder fired at a low temperature. Metal powders include powder of Cu, Ag, Au, Pt, Ni, and Sn and other electroconductive powders. Among those preferred are Cu and Ag from the viewpoint of conductivity and cost efficiency. The planar coil is formed by applying a mixture of the metal powder, a resin, and a solvent in a predetermined pattern, followed by naturally drying in the air, heating to a temperature equal to or more than the boiling point of the solvent, or heating with a reaction of, for example, reduction. The applied material is thus solidified in a coil form.

The planar coil may be formed by drying or heating a mixture of a metal powder (electroconductive powder) and a resin binder to solidify, or by a film-forming technique, such as sputtering method or plating method. Use of a mixture of a metal powder and a resin binder is preferred because it allows coil formation at a low cost. Alternatively, the planar coil may be formed by etching an electroconductive metal foil or stamping (blanking) the metal foil into a predetermined shape.

The characteristics of the coil depend on the width, the height (thickness), and the interval (space) of the wire of the planar coil. Preferably, the winding density and the width and thickness of the wire are increased as much as possible, and the interval of the windings is reduced as small as possible in the range in which the spaces between the windings maintain insulation. More specifically, the height (thickness) of the coil wire is preferably 20 μm or more, and more preferably 40 μm or more. A thin coli has a high resistance, and does not exhibit a high performance index (Q factor, quality factor). The thickness of the coil is preferably increased as much as possible according to the performance required. The smaller the winding interval (wiring interval) of the coil, the better, as described above. A large winding interval results in a large device, and the coil becomes long and accordingly has a high direct current resistance. Thus, the performance index (Q factor) is reduced. The winding interval W is preferably set at 200 μm or less. The minimum winding interval W is preferably 10 μm or more. Winding intervals W of less than 10 μm are difficult to provide constantly, and it may result in a low production yield due to, for example, a short circuit.

Further, in the above planar magnetic device, it is also preferable that the magnetic layers are made of a magnetic mixture containing 20% by mass or less of binder resin. Exemplary resin binders may include elastomers, such as celluloses, chloroprene rubbers, nitrile rubbers, polysulfides, butadiene rubbers, SBR's, and silicone rubbers; thermoplastic resin organic materials, such as vinyl acetates, polyvinyl alcohols, polyvinyl acetals, vinyl chlorides, polystyrenes, and polyimides; thermosetting resin organic materials, such as epoxy resins; and inorganic materials, such as $SiO_2$.

The above-described planar magnetic device can be manufactured by, for example, the following process. Specifically, a magnetic powder having a specific maximum particle size L and a specific average particle size D is mixed with a vehicle to prepare a paste. The paste is then printed in a shape with predetermined dimensions on a substrate to form a first magnetic layer.

A planar coil is printed in an angular spiral, meander, or round spiral pattern on the upper surface of the first magnetic layer, using an electroconductive paste, such as Ag paste or Cu paste. The planar coil can produce the same effect as long as it has a structure in which adjacent portions of the conductor windings of the coil are in parallel with each other like a meander coil. Instead of the above method of printing a metal paste, the planar coil may be formed by plating, stamping (blanking) an electroconductive metal foil, etching an electroconductive metal foil, sputtering, or vapor deposition, and the method is not particularly limited as long as the method can produce a planar coil having a low volume resistivity.

After the formation of the planar coil, a second magnetic layer is formed in a predetermined pattern with a predetermined thickness by printing so as to cover the planar coil. Thus, a thin inductor intended as a planar magnetic device, including the planar coil coated with the first and second magnetic layers is completed. In this process, an opening is formed in the magnetic pattern of the second magnetic layer in a portion corresponding to the coil terminal.

The magnetic layers may be formed on the upper and lower surfaces of the planar coil by bonding magnetic thin plates with an insulating adhesive, applying a magnetic paste prepared by dispersing a magnetic powder in a resin, followed by drying, or plating with a magnetic material. These methods may be combined.

A power IC package of the present invention is produced by mounting the planar magnetic device prepared as above and a semiconductor chip, such as a control IC or a field-effect transistor (FET), in the surface direction or the height direction on one substrate or one package. In particular, it is effective in miniaturizing the device that the power IC package is an IC-integrated type in which the planar magnetic device and an IC chip are mounted together on a substrate. A plurality of semiconductor chips and an active element may be integrally packaged in a single package. For example, the power IC package may include a power supply, such as a DC-DC convertor, or may have an external capacitor or the like for the same function of the power supply.

Since in the above-described planar magnetic device, the magnetic powder has a smaller maximum particle size L than the winding interval W (W>L), the magnetic powder can be filled in the spaces between the windings of the coil effectively. Also, the particles of the magnetic powder disposed between the windings of the coil have isometric shape as much as possible. Accordingly, the magnetic powder does not affected by the direction of the magnetic field generated by the coil, and the inductance of the planar coil is increased. Since the magnetic powder having a smaller maximum particle size L than the winding interval W fills the spaces between the windings of the planar coil, the magnetic permeability in the magnetic field generated in the planar coil can be increased, and the resulting magnetic device can act as a thin inductor exhibiting a high inductance.

The planar magnetic device produced as above may be mounted with a semiconductor chip, such as a control IC or a field-effect transistor (FET), in the surface direction or the height direction on a substrate or a package, and thus can be packaged in a single package. Thus, functional elements can be closely (densely) packed to produce remarkable effects in miniaturizing semiconductor devices and in giving advanced functions to the semiconductor devices.

BEST MODES FOR CARRYING OUT THE INVENTION

Preferable embodiments of the invention will now be described in detail with reference to the accompanying drawings and the following Examples.

EXAMPLES 1 to 5

Magnetic material powders each having any one of the compositions shown in Table 1 were screened to prepare magnetic powders having maximum particle sizes L (maximum diameter) and average particle sizes D that are shown in Table 1. The maximum particle size shown in Table 1 is represented by the value of the opening of the screen. Each magnetic powder was mixed with an ethyl cellulose solution in a proportion of 16% by mass relative to the magnetic powder to prepare a magnetic powder paste, respectively.

Figure 3:
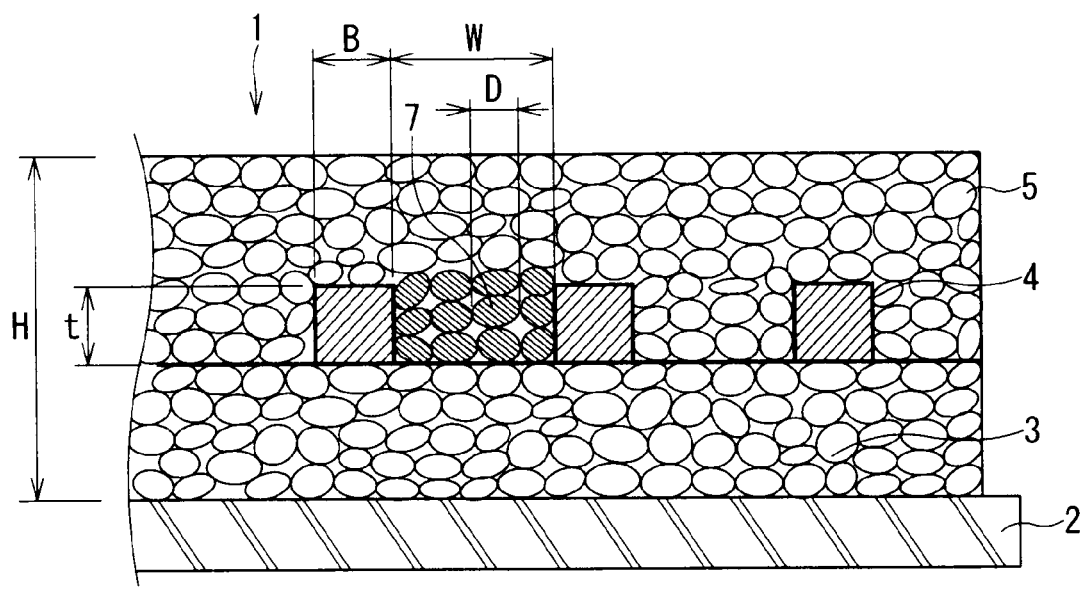
FIG. 3 is a fragmentary enlarged sectional view of portion III shown in FIG. 2.

Then, the magnetic powder paste was printed at a thickness of 150 μm on a 35 μm thick polyimide sheet as a substrate 2, as shown in FIG. 3, and was then dried at 150° C. for 60 minutes to form a first magnetic layer 3.

Figure 1:
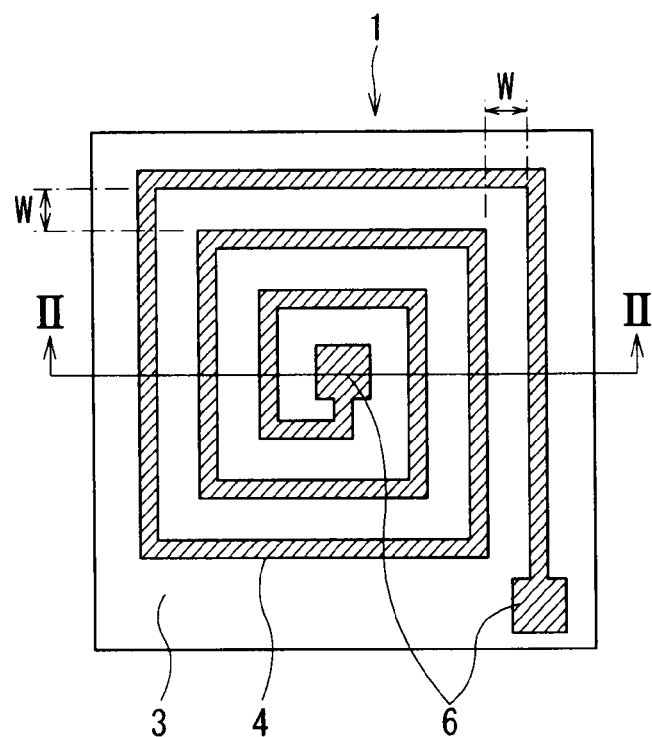
FIG. 1 is a plan view of a planar magnetic device including an angular spiral coil according to an example of the present invention.
Figure 2:
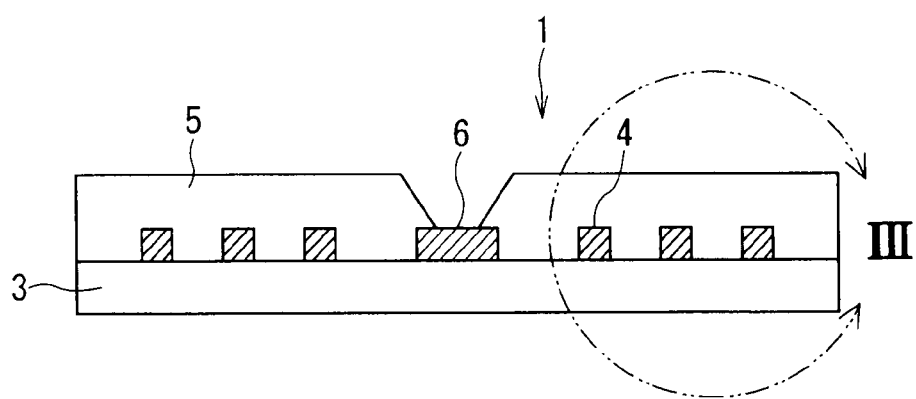
FIG. 2 is a sectional view taken in the direction of the arrows along line II-II in FIG. 1 or FIG. 5.

A 15-turn spiral coil as a planar coil 4 having a line width B of 150 μm and winding intervals W of 100 μm, that is, having a line/space ratio of 150 μm/100 μm, was printed at a thickness of 20 μm on the upper surface of the first magnetic layer 3 as shown in FIG. 1, using a Ag paste having an average particle size of 1 μm. Then, the printed paste was fired at a low temperature of 150° C. for 60 minutes, thus forming the planar coil 4. Subsequently, a second magnetic layer 5 was printed at a thickness of 150 μm on the upper surface of the planar coil 4 in the same manner as the first magnetic layer 3. Thus, thin inductors 1 were prepared as planar magnetic devices of Examples 1 to 5. In each Example, the number of magnetic powder particles disposed in a segment defined by the winding interval W was set at 3 or more.

Comparative Examples 1 to 5

A polyimide resin intended as an insulating layer is applied at a thickness of 10 μm with a bar coater on each first magnetic layer 3 formed in the Examples 1 to 5. Then, the same planar coil 4 as in Examples 1 to 5 was formed on the upper surface of the insulating layer, and the polyimide resin intended as an insulating layer was further applied at a thickness of 10 μm on the upper surface of the planar coil 4. Subsequently, the same second magnetic layer 5 as in Examples 1 to 5 was printed on the upper surface of the insulating layer. Thus, planar magnetic devices were produced as thin inductors of Comparative Examples 1 to 5.

The thickness H, the inductance, and the performance index (Q factor) of the thin inductors as planar magnetic devices of the Examples and the Comparative Examples were measured and the results are shown in Table 1.

In Table 1, the thickness H of the inductor refers to the length from the lower end of the substrate 2 to the upper end of the second magnetic layer 5 of the planar magnetic device 1 if a substrate 2 is used as shown in FIG. 3. If the substrate 2 is not used, the thickness H refers to the length from the lower end of the first magnetic layer 3 of the planar magnetic device 1 to the upper end of the second magnetic layer 5.

The thicknesses H of the thin inductors were measured with a micrometer produced by Mitutoyo. The inductance and the performance index (Q factor) of each planar magnetic device were measured at an exciting voltage of 0.5 V and a measurement frequency of 10 MHz with an impedance analyzer 4192A produced by Yokogawa-Hewlett-Packard. The results of the evaluation measurements are shown in Table 1 hereunder.

TABLE 1

| Sample No. | Magnetic Material | Composition (mass %) | Maximum Particle Size L (μm) | Average Particle Size D (μm) | Substrate/ Thickness (μm) | Binder Material | Binder Content (mass %) | Magnetic Layer Thickness First/Second (μm) |
|---|---|---|---|---|---|---|---|---|
| Example 1 | Co-based Amorphous Alloy Powder | Co—4.3Fe—8Cr—7.3Si—2.8B | 32 | 19 | Polyimido/35 | Ethyl Cellulose | 16 | 150/150 |
| Example 2 | Fe-based Amorphous Alloy Powder | Fe—3B—5.2Si | 32 | 25 | Polyimido/35 | Ethyl Cellulose | 16 | 150/150 |
| Example 3 | Sendust | Fe—10Si—5.5Al | 32 | 20 | Polyimido/35 | Ethyl Cellulose | 16 | 150/150 |
| Example 4 | Ni—Zn Ferrite | 15NiO, 35ZnO, 51Fe$_2$O$_3$ | 32 | 14 | Polyimido/35 | Ethyl Cellulose | 16 | 150/150 |
| Example 5 | Mn—Zn Ferrite | 32MnO, 17ZnO, 51Fe$_2$O$_3$ | 32 | 15 | Polyimido/35 | Ethyl Cellulose | 16 | 150/150 |
| Comparative | Co-based Amorphous | Co—4.3Fe—8Cr—7.3Si—2.8B | 106 | 82 | Polyimido/35 | Ethyl Cellulose | 16 | 150/150 |

TABLE 1-continued

| | | | | | | | | | |
|---|---|---|---|---|---|---|---|---|---|
| Example 1 | Alloy Powder | | | | | | | | |
| Comparative Example 2 | Fe-based Amorphous Alloy Powder | Fe—3B—5.2Si | 106 | 83 | Polyimido/35 | Ethyl Cellulose | 16 | 150/150 |
| Comparative Example 3 | Sendust | Fe—10Si—5.5Al | 106 | 95 | Polyimido/35 | Ethyl Cellulose | 16 | 150/150 |
| Comparative Example 4 | Ni—Zn Ferrite | 15NiO, 35ZnO, 51Fe$_2$O$_3$ | 106 | 81 | Polyimido/35 | Ethyl Cellulose | 16 | 150/150 |
| Comparative Example 5 | Mn—Zn Ferrite | 32MnO, 17ZnO, 51Fe$_2$O$_3$ | 106 | 80 | Polyimido/35 | Ethyl Cellulose | 16 | 150/150 |

| Sample No. | Insulating Layer | Planar Coil (μm) | | | | Thin Inductor | | Performance |
|---|---|---|---|---|---|---|---|---|
| | | Material | Thickness (t) | Width (B) | Distance (W) | Thickness H (μm) | Inductance (μH) | Index (Q) |
| Example 1 | — | Ag | 20 | 150 | 100 | 337 | 1.8 | 35 |
| Example 2 | — | Ag | 20 | 150 | 100 | 336 | 1.6 | 32 |
| Example 3 | — | Ag | 20 | 150 | 100 | 336 | 1.7 | 30 |
| Example 4 | — | Ag | 20 | 150 | 100 | 336 | 1.6 | 30 |
| Example 5 | — | Ag | 20 | 150 | 100 | 337 | 1.6 | 29 |
| Comparative Example 1 | Pollyimide | Ag | 20 | 150 | 100 | 336 | 1 | 20 |
| Comparative Example 2 | Pollyimide | Ag | 20 | 150 | 100 | 336 | 0.9 | 21 |
| Comparative Example 3 | Pollyimide | Ag | 20 | 150 | 100 | 336 | 0.8 | 15 |
| Comparative Example 4 | Pollyimide | Ag | 20 | 150 | 100 | 337 | 0.8 | 16 |
| Comparative Example 5 | Pollyimide | Ag | 20 | 150 | 100 | 337 | 0.9 | 15 |

As is clear from the results shown in Table 1, the planar magnetic devices 1 of the respective Examples, in which the magnetic powder having a smaller maximum particle size L than the winding interval W fills the spaces between the windings of the planar coil 4, exhibited high magnetic permeability in the magnetic field generated in the planar coil 4. The planar magnetic device 1 of each Example does not have an insulating layer between the magnetic layers 3 and 5 and the planar coil 4, and accordingly the magnetic powder is sufficiently close to the planar coil. Thus, the resulting planar magnetic device 1 as a thin inductor exhibited a sufficiently high inductance.

On the other hand, it has been confirmed that the planar magnetic devices of the Comparative Examples, each of which includes an insulating layer between the magnetic layers 3 and 5 and the planar coil 4, exhibited much lower inductances than planar coil elements of the Examples because the magnetic flux through the upper and the lower magnetic layers was reduced and the magnetic powder 7 did not sufficiently fill the spaces between the windings of the coil.

Examples 6 to 10

Magnetic material powders each having any one of the compositions shown in Table 2 were screened to prepare magnetic powders having maximum particle sizes L (maximum diameter) and average particle sizes D that are shown in Table 2. The maximum particle size shown in Table 2 is represented by the value of the opening of the screen. Each magnetic powder was mixed with an epoxy resin solution in a proportion of 11% by mass relative to the magnetic powder to prepare respective magnetic powder pastes.

Then, the magnetic powder paste was printed at a thickness of 100 μm on a 35 μm thick polyimide sheet as a substrate 2, as shown in FIG. 3, and was then dried at 150° C. for 30 minutes to form a first magnetic layer 3.

A 15-turn spiral coil as a planar coil 4 having a line width B of 100 μm and winding intervals W of 100 μm, that is, having a line/space ratio of 100 μm/100 μm, was printed at a thickness of 25 μm on the upper surface of the first magnetic layer 3 as shown in FIG. 1, using a Ag paste having an average particle size of 0.5 μm. Then, the printed paste was fired at a temperature of 200° C. for 30 minutes, thus forming the planar coil 4. Subsequently, a second magnetic layer 5 was printed at a thickness of 100 μm on the upper surface of the planar coil 4 in the same manner as the first magnetic layer 3. Thus, thin inductors 1 were prepared as planar magnetic devices of Examples 6 to 10. In each Example, the number of magnetic powder particles disposed in a segment defined by the winding interval W was set at 3 or more.

Comparative Examples 6 to 10

Thin inductors as planar magnetic devices of Comparative Examples were prepared in the same manner as in Examples 6 to 10, except that a coarse magnetic powder having a maximum particle size of 150 μm was used instead of the magnetic powder used in Examples 6 to 10 having a maximum particle size of 32 μm.

The thickness H, the inductance, and the performance index (Q factor) of the thin inductors as planar magnetic devices of the Examples and the Comparative Examples were measured in the same manner as in Examples 1 to 5, and the results are shown in Table 2.

TABLE 2

| Sample No | Magnetic Material | Composition (mass %) | Maximum Particle Size L (μm) | Average Particle Size D (μm) | Substrate/ Thickness (μm) | Binder Material | Binder Content (mass %) | Magnetic Layer Thickness First/Second (μm) |
|---|---|---|---|---|---|---|---|---|
| Example 6 | Co-based Amorphous Ally Powder | Co—4.3Fe—8Cr—7.3Si—2.8B | 32 | 19 | Polyimide/35 | Epoxy Resin | 11 | 100/100 |
| Example 7 | Fe-based Amorphous Powder | Fe—3B—5.2Si | 32 | 25 | Polyimide/35 | Epoxy Resin | 11 | 100/100 |
| Example 8 | Sendust | Fe—10Si—5.5Al | 32 | 20 | Polyimide/35 | Epoxy Resin | 11 | 100/100 |
| Example 9 | Ni—Zn Ferrite | 15NiO, 35ZnO, 51Fe$_2$O$_3$ | 32 | 14 | Polyimide/35 | Epoxy Resin | 11 | 100/100 |
| Example 10 | Mn—Zn Ferrite | 32MnO, 17ZnO, 51Fe$_2$O$_3$ | 32 | 15 | Polyimide/35 | Epoxy Resin | 11 | 100/100 |
| Comparative Example 6 | Co-based Amorphous Alloy Powder | Co—4.3Fe—8Cr—7.3Si—2.8B | 150 | 98 | Plyimide/35 | Epoxy Resin | 11 | 100/100 |
| Comparative Example 7 | Fe-based Amorphous Alloy Powder | Fe—3B—5.2Si | 150 | 110 | Polyimide/35 | Epoxy Resin | 11 | 100/100 |
| Comparative Example 8 | Sendust | Fe—10Si—5.5Al | 150 | 108 | Potyimide/35 | Epoxy Resin | 11 | 100/100 |
| Comparative Example 9 | Ni—Zn Ferrite | 15NiO, 35ZnO, 51Fe$_2$O$_3$ | 150 | 88 | Polyimide/35 | Epoxy Resin | 11 | 100/100 |
| Comparative Example 10 | Mn—Zn Ferrite | 32MnO, 17ZnO, 51Fe$_2$O$_3$ | 150 | 78 | Polyimide/35 | Epoxy Resin | 11 | 100/100 |

| Sample No | Insulating Layer | Planar Coil Material | Planar Coil Thickness (t) (μm) | Planar Coil Width (B) (μm) | Planar Coil Interval (W) (μm) | Thin Inductor Thickness H (μm) | Inductance (μH) | Performance Index (Q) |
|---|---|---|---|---|---|---|---|---|
| Example 6 | — | Ag | 25 | 100 | 100 | 236 | 1.6 | 38 |
| Example 7 | — | Ag | 25 | 100 | 100 | 237 | 1.5 | 33 |
| Example 8 | — | Ag | 25 | 100 | 100 | 236 | 1.5 | 31 |
| Example 9 | — | Ag | 25 | 100 | 100 | 236 | 1.4 | 32 |
| Example 10 | — | Ag | 25 | 100 | 100 | 237 | 1.4 | 30 |
| Comparative Example 6 | — | Ag | 25 | 100 | 100 | 236 | 0.45 | 25 |
| Comparative Example 7 | — | Ag | 25 | 100 | 100 | 236 | 0.4 | 21 |
| Comparative Example 8 | — | Ag | 25 | 100 | 100 | 236 | 0.43 | 23 |
| Comparative Example 9 | — | Ag | 25 | 100 | 100 | 237 | 0.38 | 23 |
| Comparative Example 10 | — | Ag | 25 | 100 | 100 | 237 | 0.38 | 21 |

As is clear from the results shown in Table 2, it has been found that the thin inductors of Comparative Examples 6 to 10, which use magnetic powder 7 having a larger particle size than the winding interval W, exhibited lower inductances than the thin inductors of Examples 6 to 10.

EXAMPLES 11 to 15

Magnetic material powders each having any one of the compositions shown in Table 3 were screened to prepare magnetic powders having maximum particle sizes L (maximum diameter) and average particle sizes D that are shown in Table 3. The maximum particle size shown in Table 3 is represented by the value of the opening of the screen. Each magnetic powder was mixed with a polyimide resin solution in a proportion of 12% by mass relative to the magnetic powder to prepare magnetic powder pastes.

Then, the magnetic powder paste was printed at a thickness of 150 μm on a 35 μm thick polyimide sheet as a substrate 2, as shown in FIG. 3, and was then dried at 150° C. for 30 minutes to form a first magnetic layer 3.

A 15-turn spiral coil as a planar coil 4 having a line width B of 200 μm and winding intervals W of 200 μm, that is, having a line/space ratio of 200 μm/200 μm, was printed at a thickness of 10 μm on the upper surface of the first magnetic layer 3 as shown in FIG. 1, using a low-resistance Ag paste. Then, the printed paste was fired at a temperature of 200° C. for 30 minutes, thus forming the planar coil 4. Subsequently, a second magnetic layer 5 was printed at a thickness of 200 μm on the upper surface of the planar coil 4 in the same manner as the first magnetic layer 3. Thus, thin inductors 1 were prepared as planar magnetic devices of Examples 11 to 15. In each Example, the number of magnetic powder particles disposed in a segment defined by the winding interval W of the coil was set at 3 or more.

EXAMPLES 16 to 20

Thin inductors 1 as planar magnetic devices of Examples 16 to 20 were prepared through the steps of forming and drying the first magnetic layer, the planar coil, and the second magnetic layer and then removing the polyimide sheet used as the substrate in the same manner as in Examples 11 to 15, except that silicone resin was added in a proportion of 12% by mass instead of the polyimide resin solution used as the binder of the magnetic powder in the Examples 11 to 15. In each Example, the number of magnetic powder particles disposed in a segment defined by the winding interval W of the coil was set at 3 or more.

The thickness H, the inductance, and the performance index (Q factor) of the thin inductors as planar magnetic devices of the Examples were measured in the same manner as in Examples 1 to 5, and the results are shown in Table 3.

Subsequently, a 150 μm thick second magnetic layer 5 was formed by coating the upper surface of the spiral coil 4 in the

TABLE 3

| Sample No. | Magnetic Material | Composition (mass %) | Maximum Particle Size L (μm) | Average Particle Size D (μm) | Substrate/ Thickness (μm) | Binder Material | Binder Content (mass %) | Magnetic Layer Thickness First/ Second (μm) |
|---|---|---|---|---|---|---|---|---|
| Example 11 | Co-based Amorphous Alloy Powder | Co—4.3Fe—8Cr—7.3Si—2.8B | 32 | 19 | Polyimide/35 | Polyimide Resin | 12 | 150/150 |
| Example 12 | Fe-based Amorphous Alloy Powder | Fe—3B—5.2Si | 32 | 25 | Polyimide/35 | Polyimide Resin | 12 | 150/150 |
| Example 13 | Sendust | Fe—10Si—5.5Al | 32 | 20 | Polyimide/35 | Polyimide Resin | 12 | 150/150 |
| Example 14 | Ni—Zn Ferrite | 15NiO, 35ZnO, 51$Fe_2O_3$ | 32 | 14 | Polyimide/35 | Polyimide Resin | 12 | 150/150 |
| Example 15 | Mn—Zn ferrite | 32MnO, 17ZnO, 51$Fe_2O_3$ | 32 | 15 | Polyimide/35 | Polyimide Resin | 12 | 150/150 |
| Example 16 | Co-based Amorphous Alloy Powder | Co—4.3Fe—8Cr—7.3Si—2.8B | 32 | 19 | Polyimide/35 | Silicone Resin | 12 | 150/150 |
| Example 17 | Fe-based Amorphous Alloy Powder | Fe—3B—5.2Si | 32 | 25 | Polyimide/35 | Silicone Resin | 12 | 150/150 |
| Example 18 | Sendust | Fe—10Si—5.5Al | 32 | 20 | Polyimide/35 | Silicone Resin | 12 | 150/150 |
| Example 19 | Ni—Zn Ferrite | 15NiO, 35ZnO, 51$Fe_2O_3$ | 32 | 14 | Polyimide/35 | Silicone Resin | 12 | 150/150 |
| Example 20 | Mn—Zn Ferrite | 32MnO, 17ZnO, 51$Fe_2O_3$ | 32 | 15 | Polyimide/35 | Silicone Resin | 12 | 150/150 |

| Sample No. | Insulating Layer | Planar Coil (μm) Material | Thickness (t) | Width (B) | Interval (W) | Thin Inductor Thickness H (μm) | Inductance (μH) | Performance Index (Q) |
|---|---|---|---|---|---|---|---|---|
| Example 11 | — | Ag | 10 | 200 | 200 | 336 | 2.2 | 25 |
| Example 12 | — | Ag | 10 | 200 | 200 | 337 | 2.1 | 24 |
| Example 13 | — | Ag | 10 | 200 | 200 | 336 | 2 | 24 |
| Example 14 | — | Ag | 10 | 200 | 200 | 336 | 2 | 24 |
| Example 15 | — | Ag | 10 | 200 | 200 | 336 | 2 | 23 |
| Example 16 | — | Ag | 10 | 200 | 200 | 301 | 2.1 | 25 |
| Example 17 | — | Ag | 10 | 200 | 200 | 302 | 2.1 | 24 |
| Example 18 | — | Ag | 10 | 200 | 200 | 302 | 2 | 24 |
| Example 19 | — | Ag | 10 | 200 | 200 | 302 | 1.9 | 24 |
| Example 20 | — | Ag | 10 | 200 | 200 | 302 | 2 | 24 |

As is clear from the results shown in Table 3, it has been confirmed that thin inductors stable in inductance can be produced irrespective of the type of binder mixed with the magnetic powder and of the presence or absence of the polyimide sheet as the substrate.

EXAMPLE 21

A magnetic powder having the composition shown in Table 4 was screened to prepare a magnetic powder having a maximum particle size L (maximum diameter) and an average particle size D that are shown in Table 4. The maximum particle size shown in Table 4 is represented by the value of the opening of the screen. The magnetic powder was mixed with an ethyl cellulose solution in a proportion of 16% by mass relative to the magnetic powder to prepare magnetic powder pastes.

Then, the magnetic powder paste was printed at a thickness of 150 μm on a 20 μm thick PEN sheet as a substrate 2, as shown in FIG. 3, and was then dried at 150° C. for 60 minutes to form a first magnetic layer 3.

Then, a Ag paste having an average particle size of 1 μm was printed at a thickness of 30 μm on the upper surface of the first magnetic layer 3, and was fired at a low temperature of 150° C. for 60 minutes to form a planar coil 4. The resulting planar coil 4 was a 15-turn spiral coil, as shown in FIGS. 1 and 3, having a line width B of 200 μm and winding intervals W of 200 μm, that is, having a line/space ratio of 200 μm/200 μm.

same manner as the first magnetic layer 3. Thus, thin inductor 1 was prepared as a planar magnetic device of Example 21. In this Example, the number of magnetic powder particles disposed in a segment defined by the winding interval W of the coil was set at 3 or more.

EXAMPLE 22

A thin inductor 1 as a planar magnetic device of Example 22 was prepared in the same manner as in Example 21, except that a spiral planar coil formed by etching was used instead of the spiral planar coil formed by printing in Example 21.

EXAMPLES 23 to 26

Thin inductors 1 of Examples 23 and 26 as shown in FIG. 1 were prepared through forming spiral coils by etching according to the material and dimensional specifications shown in Table 4.

EXAMPLES 27 and 28

Figure 4:
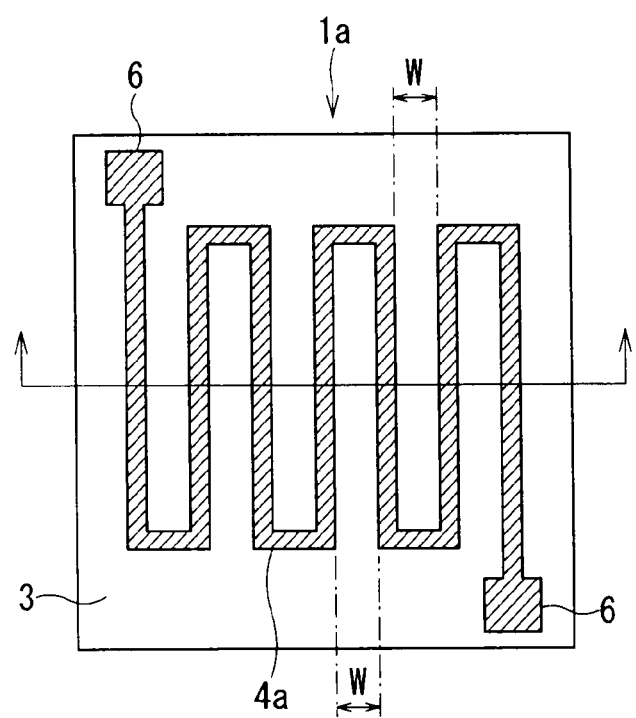
FIG. 4 is a plan view of a planar magnetic device including a meander coil according to an example of the present invention.

Thin inductors 1a of Examples 27 and 28 were prepared in the same manner as in Examples 25 and 26, except that meander coils as shown in FIG. 4 formed according to the material and dimensional specifications shown in Table 4 were used instead of the spiral coils.

Comparative Examples 11 and 12

Thin inductors as planar magnetic devices of Comparative Examples 11 and 12 were prepared in the same manner as in Comparative Example 1, except that a spiral coil was formed by etching according to the material and dimensional specifications shown Table 4.

The thickness H, the inductance, and the performance index (Q factor) of the thin inductors as the planar magnetic devices of the above Examples and Comparative Examples were measured in the same manner as in Examples 1 to 5, and the results are shown in Table 4 below.

Also, since the resistance of the Cu foil planar coil is lower than that of the Ag planar coil, the performance index (Q factor) of the Cu foil coil is relatively increased.

In addition, it has been found from the comparisons between the thin inductors using spiral coils of Examples 21 to 26 and the thin inductors using meander coils of Examples 27 and 28, that the meander coils cannot increase the inductance and accordingly lead to inferior characteristics. However, the meander coil allows connection terminals to be disposed in the outer region of the substrate. This means that the meander coil is superior in mountability to the spiral coil.

TABLE 4

| Sample No. | Magnetic Material | Composition (mass %) | Maximum Particle Size L (μm) | Average Particle Size D (μm) | Substrate/ Thickness (μm) | Binder Material | Binder Content (mass %) | Magnetic Layer Thickness First/Second (μm) | Insulating Layer |
|---|---|---|---|---|---|---|---|---|---|
| Example 21 | Silicon Steel | Fe—4Si | 32 | 10 | PEN/20 | Ethyl Cellulose | 16 | 180/180 | — |
| Example 22 | Permalloy | Fe—78.5Ni | 32 | 11 | PEN/20 | Ethyl Cellulose | 16 | 180/180 | — |
| Example 23 | Silicon Steel | Fe—4Si | 32 | 10 | PEN/20 | Ethyl Cellulose | 16 | 180/180 | — |
| Example 24 | Permalloy | Fe—78.5Ni | 32 | 11 | PEN/20 | Ethyl Cellulose | 16 | 180/180 | — |
| Example 25 | Silicon Steel | Fe—4Si | 105 | 72 | PEN/20 | Ethyl Cellulose | 16 | 180/180 | — |
| Example 26 | Permalloy | Fe—78.5Ni | 105 | 69 | PEN/20 | Ethyl Cellulose | 16 | 180/180 | — |
| Example 27 | Silicon Steel | Fe—4Si | 32 | 10 | PEN/20 | Ethyl Cellulose | 16 | 180/180 | — |
| Example 28 | Permalloy | Fe—78.5Ni | 32 | 11 | PEN/20 | Ethyl Cellulose | 16 | 180/180 | — |
| Comparative Example 11 | Silicon Steel | Fe—4Si | 105 | 88 | PEN/20 | Ethyl Cellulose | 16 | 180/180 | — |
| Comparative Example 12 | Permalloy | Fe—78.5Ni | 105 | 83 | PEN/20 | Ethyl Cellulose | 16 | 180/180 | — |

| Sample No. | Planar Coil (μm) Material | Type | Thickness (t) | Width (B) | Interval (W) | Thin Film Inductor Thickness H (μm) | Inductance (μH) | Performance Index (Q) |
|---|---|---|---|---|---|---|---|---|
| Example 21 | Ag (sintering) | Spiral | 30 | 200 | 200 | 382 | 2.1 | 25 |
| Example 22 | Ag (sintering) | Spiral | 30 | 200 | 200 | 382 | 2.2 | 26 |
| Example 23 | Cu Foil (Etching) | Spiral | 30 | 200 | 200 | 382 | 2.3 | 43 |
| Example 24 | Cu Foil (Etching) | Spiral | 30 | 200 | 200 | 382 | 2.4 | 46 |
| Example 25 | Cu Foil (Etching) | Spiral | 30 | 200 | 200 | 382 | 1.3 | 26 |
| Example 26 | Cu Foil (Etching) | Spiral | 30 | 200 | 200 | 382 | 1.4 | 27 |
| Example 27 | Cu Foil (Etching) | Meander | 30 | 200 | 200 | 382 | 0.4 | 12 |
| Example 28 | Cu Foil (Etching) | Meander | 30 | 200 | 200 | 382 | 0.5 | 13 |
| Comparative Example 11 | Cu Foil (Etching) | Spiral | 30 | 200 | 200 | 382 | 1 | 18 |
| Comparative Example 12 | Cu Foil (Etching) | Spiral | 30 | 200 | 200 | 382 | 1.1 | 19 |

As is clear from the result shown in Table 4, it has been confirmed from the comparisons between Examples 21 and 23 and between Examples 22 and 24 that the thin inductors of Examples 23 and 24 using the planar coils formed by etching exhibited more improved characteristics than the thin inductors of Examples 21 and 22 using the spiral coils formed by firing a Ag paste. This is because the winding intervals of the planar coil formed by etching in Example 23 or 24 are increased upward, and accordingly magnetic particles can easily enter the spaces between the windings. Thus, the number of magnetic particles between the windings is increased to increase the inductance.

In the comparison between Example 27 and Example 28, both of which use meander coils, Example 28 exhibited superior characteristics.

EXAMPLES 29 to 32

The inductors of Examples 29 to 32 as shown in FIG. 1 were prepared in the same manner as in Example 11, except that the number of magnetic particles disposed in the segment having a length W defined by the winding interval W was changed as shown in Table 5.

The thickness H, the inductance, and the performance index (Q factor) of the thin inductors as the planar magnetic devices of the above Examples were measured in the same manner as in Examples 1 to 5, and the results are shown in Table 5 below.

TABLE 5

| Sample no. | Magnetic Material | Composition (mass %) | Maximum Particle Size L (μm) | Average Particle Size D (μm) | Magnetic Particle Number contained in Winding Interval W | Substrate/ Thickness (μm) | Binder Material | Content (mass %) | Magnetic Layer Thickness First/ Second (μm) |
|---|---|---|---|---|---|---|---|---|---|
| Example 29 | Co-based Amorphous Alloy Powder | Co—4.3Fe—8Cr—7.3Si—2.8B | 32 | 19 | 3 | Polyimide/35 | Polyimide Resin | 12 | 150/150 |
| Example 30 | Co-based Amorphous Alloy Powder | Co—4.3Fe—8Cr—7.3Si—2.8B | 32 | 19 | 4 | Polyimide/35 | Polyimide Resin | 12 | 150/150 |
| Example 31 | Co-based Amorphous Alloy Powder | Co—4.3Fe—8Cr—7.3Si—2.8B | 32 | 19 | 6 | Polyimide/35 | Polyimide Resin | 12 | 150/150 |
| Example 32 | Co-based Amorphous Alloy Powder | Co—4.3Fe—8Cr—7.3Si—2.8B | 32 | 19 | 8 | Polyimide/35 | Polyimide Resin | 12 | 150/150 |

| Sample no. | Insulating Layer | Planar Coil (μm) | | | | Thin Film Inductor Thickness H (μm) | Inductance (μH) | Performance Index (Q) |
|---|---|---|---|---|---|---|---|---|
| | | Material | Thickness (t) | Width (B) | Interval (W) | | | |
| Example 29 | — | Ag | 10 | 200 | 200 | 337 | 1.55 | 20 |
| Example 30 | — | Ag | 10 | 200 | 200 | 336 | 1.8 | 22 |
| Example 31 | — | Ag | 10 | 200 | 200 | 337 | 2.1 | 23 |
| Example 32 | — | Ag | 10 | 200 | 200 | 336 | 2.3 | 24 |

As is clear from the results shown in Table 5, it has been found that the inductance and the performance index are increased if at least three or at least five magnetic particles are disposed in the segment having the length W. In Examples 29 and 32, magnetic powders having the same maximum particle size and the same average particle size were used. However, particles of magnetic powders have various shapes, such as flat shape, sphere, and rod shape, and are different in length-to-width ratio (aspect ratio) to some extent depending on the shape. The number of particles filled and disposed in the intervals W between the windings is therefore changed even though the average particle sizes are the same.

Figure 5:
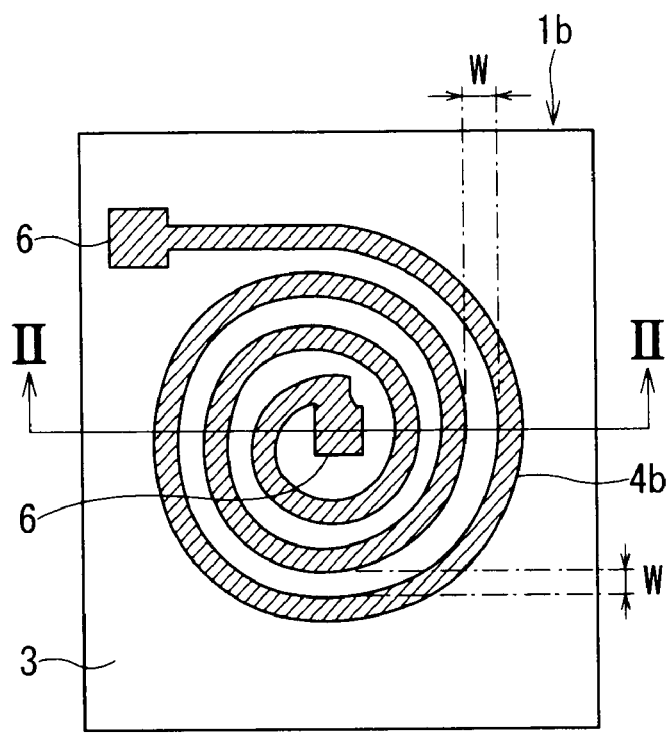
FIG. 5 is a plan view of a planar magnetic device including a round spiral coil according to an example of the present invention.
Figure 6:
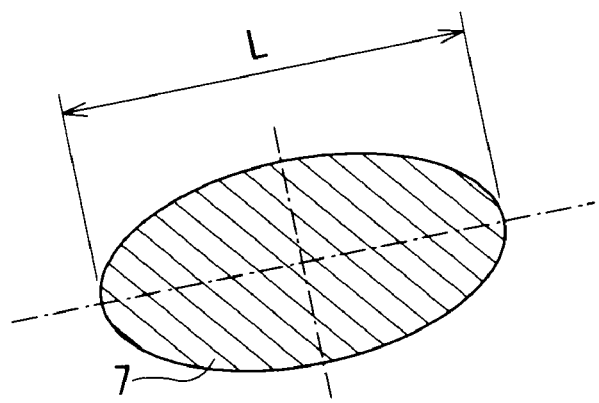
FIG. 6 is a sectional view showing a method for measuring the size of magnetic particles shown in FIG. 3.
Figure 7:
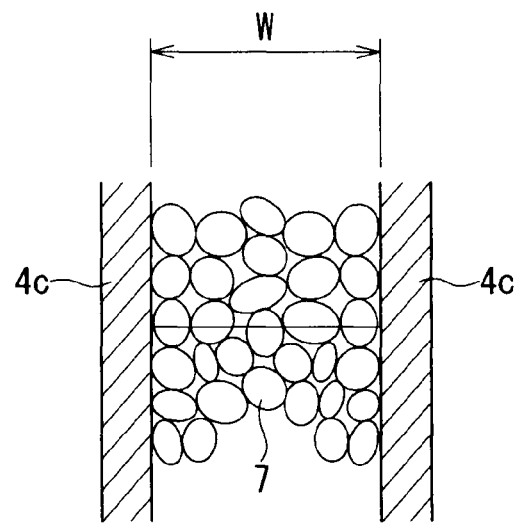
FIG. 7 is a sectional view showing a method for measuring the number of magnetic particles filling the width W shown in FIG. 3 of the spaces between the windings of the coil.

While the above examples have illustrated planar magnetic devices each having an angular spiral coil as shown in FIG. 1 or a meander coil as shown in FIG. 4 as a planar coil, the present invention is not limited to those Examples. For example, a round spiral planar coil 4b having a terminal 6, as shown in FIG. 5 may be formed on a magnetic layer 3, and can produce the same effect.

Figure 9:
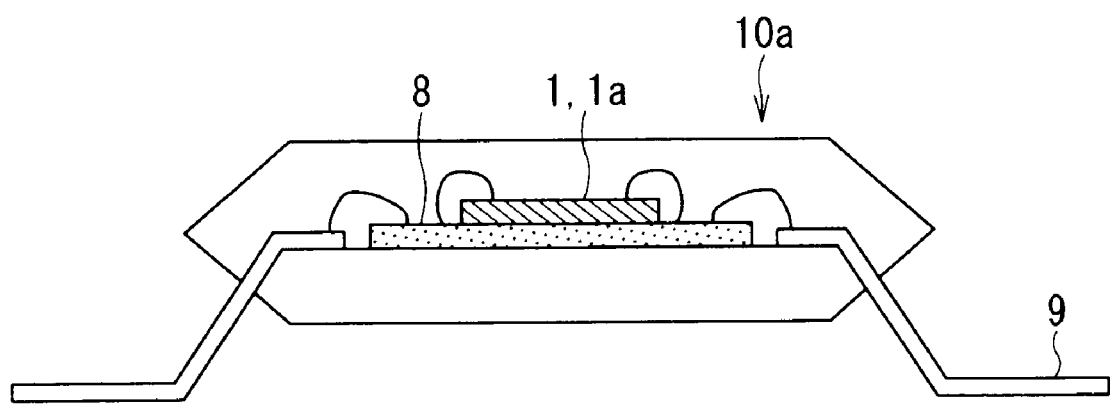
FIG. 9 is a sectional view of an IC package produced by packaging a planar magnetic device of the invention and a semiconductor chip that are stacked and laminated one on top of the other.
Figure 10:
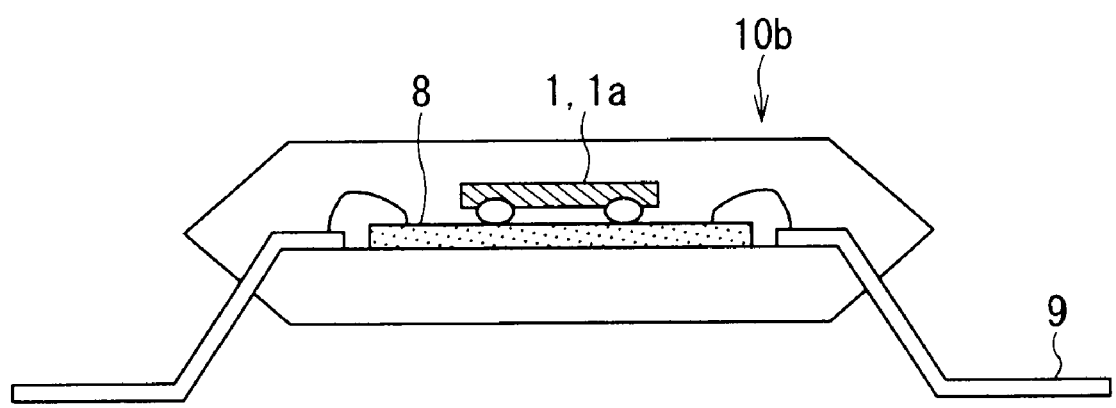
FIG. 10 is a sectional view of an IC package produced by packaging a planar magnetic device of the invention and a semiconductor chip that are stacked and laminated with bumps.

The thin inductors 1 and 1a intended as planar magnetic devices 1 of the Examples each have a thickness H of 0.26 to 0.39 mm. This thickness is smaller than the thicknesses of semiconductor chips 8, such as control IC's and field-effect transistors (FET's). By integrally packaging a semiconductor chip 8, such as a switching IC, and the planar magnetic device 1 or 1a as shown in FIGS. 8 to 10, a thin IC package 10, 10a, or 10b containing an inductor can be achieved.

Figure 8:
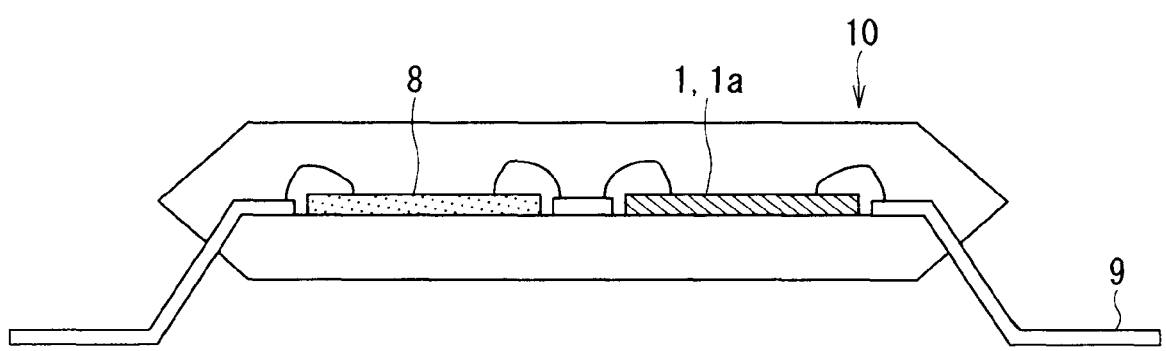
FIG. 8 is a sectional view of an IC package of produced by packaging a planar magnetic device of the invention and a semiconductor chip that are disposed on a plane surface.

In the IC package 10 shown in FIG. 8, a semiconductor chip 8 and the planar magnetic device 1 or 1a are disposed on a package substrate in the direction along the surface of the substrate, and are respectively connected to lead frames 9 with a molding compound fixing the components. In the IC package 10a shown in FIG. 9, a semiconductor chip 8 and a planar magnetic device 1 or 1a are laminated and stacked one on top of the other on a package substrate in the thickness direction of the substrate, and are respectively connected to lead frames 9 with a molding compound fixing the components. In the IC package 10b shown in FIG. 10, a semiconductor chip 8 and a planar magnetic device 1 or 1a are laminated and stacked one on top of the other on a package substrate in the thickness direction of the substrate with bump connection in between, and are respectively connected to lead frames 9 with a molding compound fixing the components.

According to these thin packages including an inductor as a planar magnetic device, a miniature DC-DC converter IC or power IC package, for example, can be easily achieved.

As is clear from the results shown in the Tables, the planar magnetic devices of the Examples, in which magnetic powder having a smaller maximum particle size L than the winding interval W of the coil fills the spaces between the windings of the planar coil, can increase the magnetic permeability in the magnetic field generated in the planar coil, and thus can be used as thin inductors having a high inductance.

The planar magnetic device produced as above can be mounted with a semiconductor chip, such as a control IC or a field-effect transistor (FET), in the surface direction or the height direction on a substrate or a package and thus can be packaged in a single package. Thus, the invention allows functional elements to be densely and closely packed, producing significant effects in miniaturizing semiconductor devices and enhancing the functionality of the devices.

In particular, a planar magnetic device including a spiral coil whose spaces between the windings are filled with a paste containing a fine magnetic powder having a predetermined particle size and a small amount of organic binder allows the magnetic particles to be closest to each other without covering the fine magnetic powder with an insulator, such as an organic material, and thus can prevent the reduction of the magnetic permeability. Consequently, in particular, a high inductance can be exhibited.

INDUSTRIAL APPLICABILITY

In the planar magnetic device of the present invention, the maximum particle size L of the magnetic powder is smaller than the winding interval W of the coil (W>L). The magnetic powder can be therefore filled into the spaces between the windings of the coil effectively. Also, the magnetic particles filling the spaces of the windings are isometric shape as much as possible. Accordingly, the magnetic powder does not affected by the direction of the magnetic field generated by the coil, and the inductance of the planar coil is increased. In addition, since the magnetic powder having a smaller maximum particle size L than the winding interval W fills spaces between the windings of the planar coil, the magnetic permeability in the magnetic field generated in the planar coil can be increased, and the resulting magnetic device can be used as a thin inductor exhibiting a high inductance.

The planar magnetic device produced as above can be mounted with a semiconductor chip, such as a control IC or a field-effect transistor (FET), in the surface direction or the height direction on a substrate or a package and thus can be packaged in a single package. Thus, the invention allows functional elements to be densely packed, producing significant effects in miniaturizing semiconductor devices and enhancing the functionality of the devices.

The invention claimed is:

1. A planar magnetic device comprising:
a first magnetic layer and a second magnetic layer that are made of a mixture of a magnetic powder and a resin; and
a planar coil disposed between the first magnetic layer and the second magnetic layer,
wherein the planar coil and the magnetic powder satisfy the relationship W >2L, where W represents the intervals between adjacent windings of the planar coil and L represents the maximum particle size of the magnetic powder,
wherein the intervals W between adjacent windings of the planar coil are filled with the mixture of the magnetic powder and the resin, and the planar magnetic device has a thickness of 0.4 mm or less,
wherein at least three particles of the magnetic powder are disposed in a segment having a length w defined by the adjacent winding interval W of the planar coil, and an insulating layer is not formed between the magnetic layers and the planar coil, and
wherein the magnetic powder contained in the magnetic layer is close to the planar coil at a distance of 1 µm or less or is in contact with the planar coil, the thickness of the planar coil is 10 to 200 µm, and the interval W is 10 µm or more.

2. The planar magnetic device according to claim 1, wherein at least five particles of the magnetic powder are disposed in the segment having the length W defined by the adjacent winding interval W.

3. The planar magnetic device according to claim 1, wherein the magnetic powder contains at least one selected from the group consisting of amorphous alloys, fine crystal alloys, pure iron, sendust, Fe-Ni alloys, Fe-Si alloys, and ferrites.

4. The planar magnetic device according to claim 1, wherein the magnetic powder has an average particle size of 80 µm or less.

5. The planar magnetic device according to claim 1, wherein the planar coil is made of a sintered body of metal powder.

6. The planar magnetic device according to claim 1, wherein the planar coil is formed by etching a metal foil.

7. A power IC package comprising:
a planar magnetic device comprising:
a first magnetic layer and a second magnetic layer that are made of a mixture of a magnetic powder and a resin; and
a planar coil disposed between the first magnetic layer and the second magnetic layer,
wherein the planar coil and the magnetic powder satisfy the relationship W >2L, where W represents the intervals between adjacent windings of the planar coil and L represents the maximum particle size of the magnetic powder, and
wherein the intervals W between adjacent windings of the planar coil are filled with the mixture of the magnetic powder and the resin, and the planar magnetic device has a thickness of 0.4 mm or less,
wherein at least three particles of the magnetic powder are disposed in a segment having a length w defined by the adjacent winding interval W of the planar coil, and an insulating layer is not formed between the magnetic layers and the planar coil, and
wherein the magnetic powder contained in the magnetic layer is close to the planar coil at a distance of 1 µm or less or is in contact with the planar coil, the thickness of the planar coil is 10 to 200 µm, and the interval W is 10 µm or more.

8. The power IC package according to claim 7, wherein the power IC package is integrated with an IC.

9. The planar magnetic device according to claim 7, wherein at least five particles of the magnetic powder are disposed in the segment having the length W defined by the adjacent winding interval W.

10. The planar magnetic device according to claim 7, wherein the magnetic powder contains at least one selected from the group consisting of amorphous alloys, fine crystal alloys, pure iron, sendust, Fe-Ni alloys, Fe-Si alloys, and ferrites.

11. The planar magnetic device according to claim 7, wherein the magnetic powder has an average particle size of 80 µm or less.

12. The planar magnetic device according to claim 7, wherein the planar coil is made of a sintered body of metal powder.

13. The planar magnetic device according to claim 7, wherein the planar coil is formed by etching a metal foil.

* * * * *